(12) United States Patent
Wen et al.

(10) Patent No.: US 9,735,235 B2
(45) Date of Patent: Aug. 15, 2017

(54) NANOWIRE AND METHOD OF FABRICATING THE SAME

(71) Applicant: UNITED MICROELECTRONICS CORP., Hsin-Chu (TW)

(72) Inventors: Tsai-Yu Wen, Tainan (TW); Chin-Sheng Yang, Hsinchu (TW); Chun-Jen Chen, Tainan (TW); Tsuo-Wen Lu, Kaohsiung (TW); Yu-Ren Wang, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/215,609

(22) Filed: Jul. 21, 2016

(65) Prior Publication Data
US 2016/0329400 A1 Nov. 10, 2016

Related U.S. Application Data

(62) Division of application No. 14/658,262, filed on Mar. 16, 2015, now Pat. No. 9,431,483.

(51) Int. Cl.
| | |
|---|---|
| H01L 21/02 | (2006.01) |
| H01L 29/06 | (2006.01) |
| H01L 21/306 | (2006.01) |
| H01L 29/161 | (2006.01) |
| H01L 21/316 | (2006.01) |
| H01L 29/66 | (2006.01) |
| H01L 29/775 | (2006.01) |
| H01L 29/78 | (2006.01) |
| H01L 29/165 | (2006.01) |

(52) U.S. Cl.
CPC ...... *H01L 29/0673* (2013.01); *H01L 21/0243* (2013.01); *H01L 21/0245* (2013.01); *H01L 21/02164* (2013.01); *H01L 21/02233* (2013.01); *H01L 21/02236* (2013.01); *H01L 21/02381* (2013.01); *H01L 21/02452* (2013.01); *H01L 21/02532* (2013.01); *H01L 21/02535* (2013.01); *H01L 21/02603* (2013.01); *H01L 21/02612* (2013.01); *H01L 21/02639* (2013.01); *H01L 21/02664* (2013.01); *H01L 21/30604* (2013.01); *H01L 21/31658* (2013.01); *H01L 29/161* (2013.01); *H01L 29/66439* (2013.01); *H01L 29/66795* (2013.01); *H01L 29/775* (2013.01); *H01L 29/785* (2013.01); *H01L 29/165* (2013.01)

(58) Field of Classification Search
CPC ......... H01L 21/02214; H01L 21/02225; H01L 21/02227; H01L 21/02365; H01L 21/3165
See application file for complete search history.

(56) References Cited

U.S. PATENT DOCUMENTS

| | | | |
|---|---|---|---|
| 7,851,790 B2 | 12/2010 | Rachmady | |
| 2010/0164102 A1* | 7/2010 | Rachmady | B82Y 10/00 257/741 |
| 2015/0041899 A1* | 2/2015 | Yang | H01L 27/0922 257/351 |

* cited by examiner

*Primary Examiner* — Cheung Lee
(74) *Attorney, Agent, or Firm* — Winston Hsu

(57) ABSTRACT

A method of forming a nanowire includes providing a substrate. The substrate is etched to form at least one fin. Subsequently, a first epitaxial layer is formed on an upper portion of the fin. Later, an undercut is formed on a middle portion the fin. A second epitaxial layer is formed to fill into the undercut. Finally, the fin, the first epitaxial layer and the second epitaxial layer are oxidized to condense the first epitaxial layer and the second epitaxial layer into a germanium-containing nanowire.

4 Claims, 7 Drawing Sheets

NANOWIRE AND METHOD OF FABRICATING THE SAME

CROSS REFERENCE TO RELATED APPLICATIONS

This patent application is a divisional application of and claims priority to U.S. patent application Ser. No. 14/658,262, filed on Mar. 16, 2015, and entitled "nanowire and method of fabricating the same" the entire contents of which are incorporated herein by reference.

BACKGROUND OF THE INVENTION

1. Field of the Invention

The present invention relates to a nanowire with uniform electrical characteristics and a method of fabricating the same.

2. Description of the Prior Art

Gordon Moore originally observed that technology innovation led to a doubling of the density of an integrated circuit (IC) chip approximately every 12 months. Over the ensuing decades, the semiconductor industry has adhered closely to Moore's Law regarding increase of density of transistors for each generation of IC chips.

With the increasing down scaling of integrated circuits and correspondingly higher requirements, transistors need to have higher drive currents with increasingly smaller dimensions. Fin field-effect transistors (FinFETs) have been developed as an answer to these problems.

Nanowires are used in FinFETs to achieve high mobility transistor channels and low dimensional quantum transportation. Fabrication of nanowires with uniform electrical characteristics is therefore important.

SUMMARY OF THE INVENTION

In one aspect of the present disclosure, a method of forming a nanowire includes providing a substrate. The substrate is etched to form at least one fin. Subsequently, a first epitaxial layer is formed on an upper portion of the fin. Later, an undercut is formed on a middle portion the fin. A second epitaxial layer is formed to fill into the undercut. Finally, the fin, the first epitaxial layer and the second epitaxial layer are oxidized to condense the first epitaxial layer and the second epitaxial layer into a germanium-containing nanowire.

In another aspect of the present disclosure, a nanowire, suspended by a pad consisting of a first type atom includes an out surface, an axis, the first type atom and a second type atom different from the first type atom, wherein a concentration of the second type atom decreases in a direction from the out surface to the axis.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
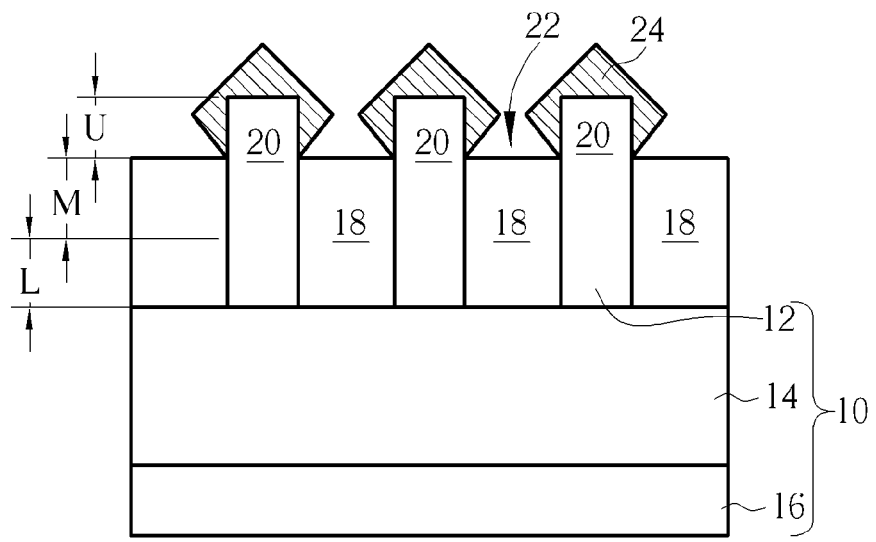
FIG. 1 to FIG. 7 illustrate a method of forming a nanowire in accordance with a preferred embodiment of the present invention.

FIG. 1 to FIG. 7 illustrate a method of forming a nanowire in accordance with a preferred embodiment of the present invention. As shown in FIG. 1, a substrate 10 having at least one fin 20 is provided. The substrate 10 may be a bulk silicon substrate, a silicon-on-insulator (SOI) wafer or a bulk germanium substrate. Subsequent figures show a silicon-on-insulator (SOI) wafer as an example. The substrate 10 includes a single crystal silicon layer 12 defined on a buried oxide (BOX) layer 14 that is disposed on a silicon wafer 16. In other embodiment, the single crystal silicon layer 12 may be replaced by a germanium layer. There are preferably numerous fins 20. The fins 20 are formed by part of the single crystal silicon layer 12. A silicon oxide layer 18 is disposed at two sides of each fin 20, i.e. the silicon oxide layer 18 is disposed between two adjacent fins 20. Each fin 20 is defined into an upper portion U, a middle portion M and a lower portion L. The upper portion U of each fin 20 protrudes from the silicon oxide layer 18. In a preferred embodiment, the fins 20 and the silicon oxide layer 18 can be formed by the following steps. First, a substrate 10 having a planar top surface is provided. A patterned hard mask (not shown) is formed on the substrate 10 and the substrate 10 is etched to create fins 20 by taking the patterned photoresist as a mask. At this point, a trench 22 is formed adjacent to each fin 20. Subsequently, a silicon oxide layer 18 is deposited in the trench 22, and the excess silicon oxide layer 18 may be polished. Then, the hard mask is removed. Finally, the silicon oxide layer 18 is partly etched to expose the upper portion U of each fin 20.

Figure 2:
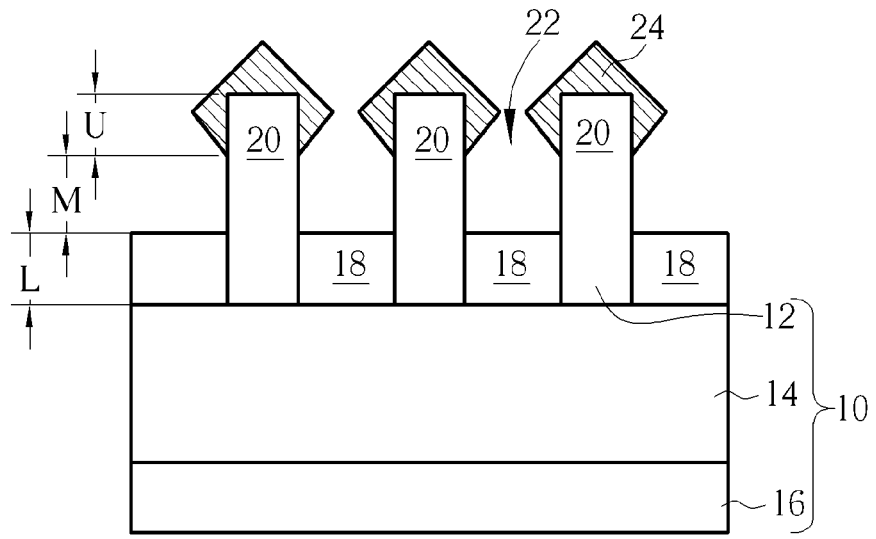
Figure 3:
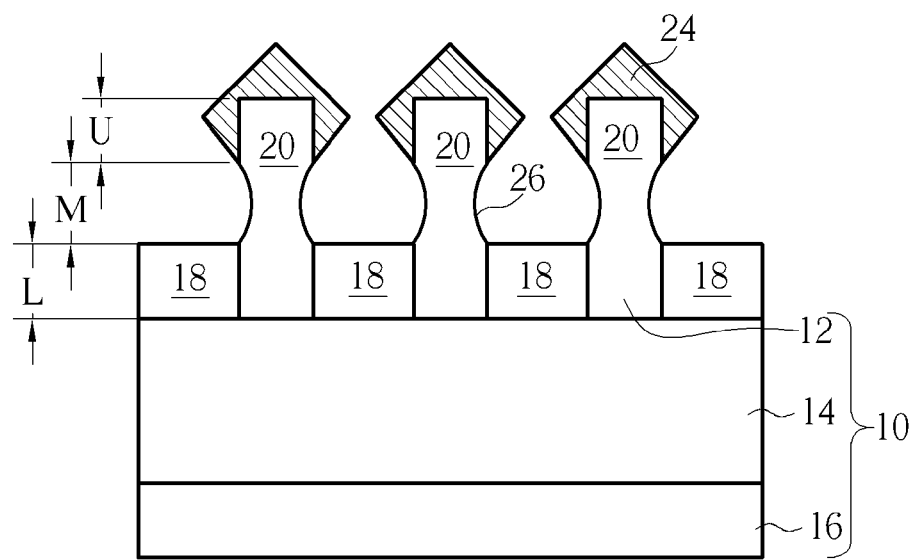

Still referring to FIG. 1, a first epitaxial process is performed to form a first epitaxial layer 24 on the upper portion U of each fin 20. The first epitaxial layer 24 may be silicon germanium, germanium, germanium tin, or silicon-germanium-tin. This embodiment takes silicon germanium as an example. The first epitaxial layer 24 may look like a cap cladding over the upper portion U. The first epitaxial layer 24 preferably has a chemical formula of $Si_{1-x}Ge_x$, where $X \geq 0.5$. The first epitaxial layer 24 can be doped or undoped. As shown in FIG. 2, the silicon oxide layer 18 is partly removed to expose a middle portion M of each fin 20. Referring to FIG. 3, the middle portion M of each fin 20 is etched to form an undercut 26 on the middle portion M of each fin 20.

Figure 4:
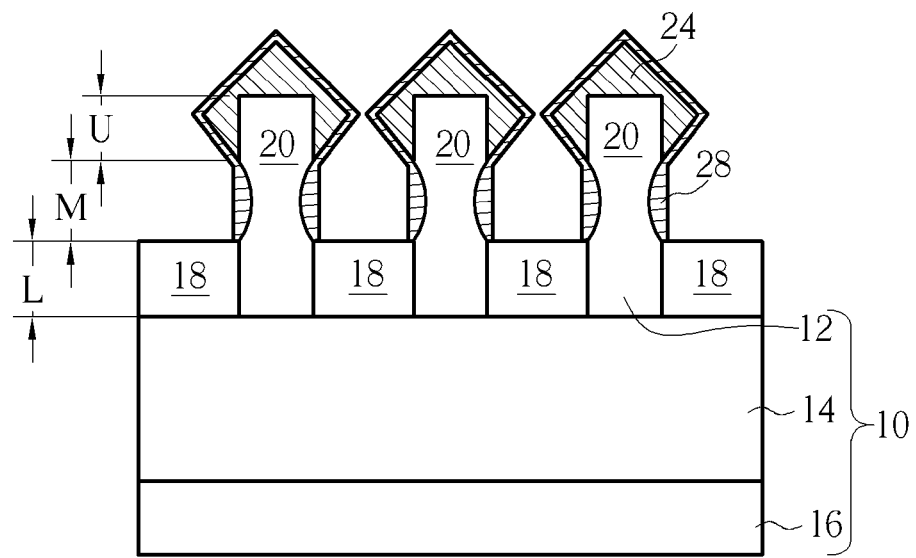

As shown in FIG. 4, a second epitaxial process is performed to form a second epitaxial layer 28 to fill in the undercut 26. The second epitaxial layer 28 may be silicon germanium, germanium, germanium tin, or silicon-germanium-tin. This embodiment takes silicon germanium as an example. The undercut 26 is preferably filled up by the second epitaxial layer 28. More specifically, the second epitaxial layer 28 extends to the position of the first epitaxial layer 24, so the second epitaxial layer 28 is connected to the first epitaxial layer 24. The second epitaxial layer 28 has a chemical formula of $Si_{1-y}Ge_y$, where $Y \geq X$. Preferably, $Y \geq 0.5$. The second epitaxial layer 28 can be doped or undoped, so the second epitaxial layer 28 either contains more germanium than the first epitaxial layer 24 or contains an equal amount.

Figure 5:
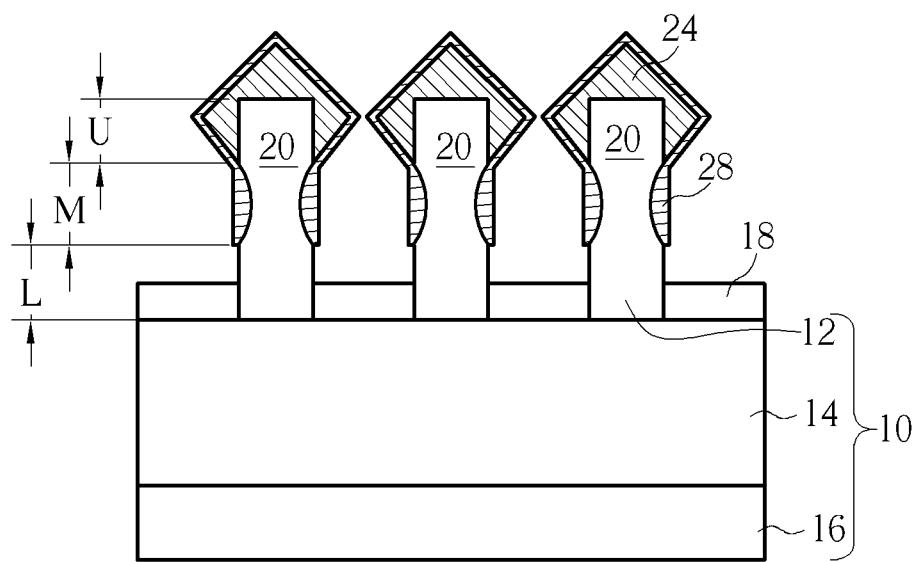

As shown in FIG. 5, the silicon oxide layer 18 is partly removed to expose part of the lower portion L of each fin 20.

Figure 6:
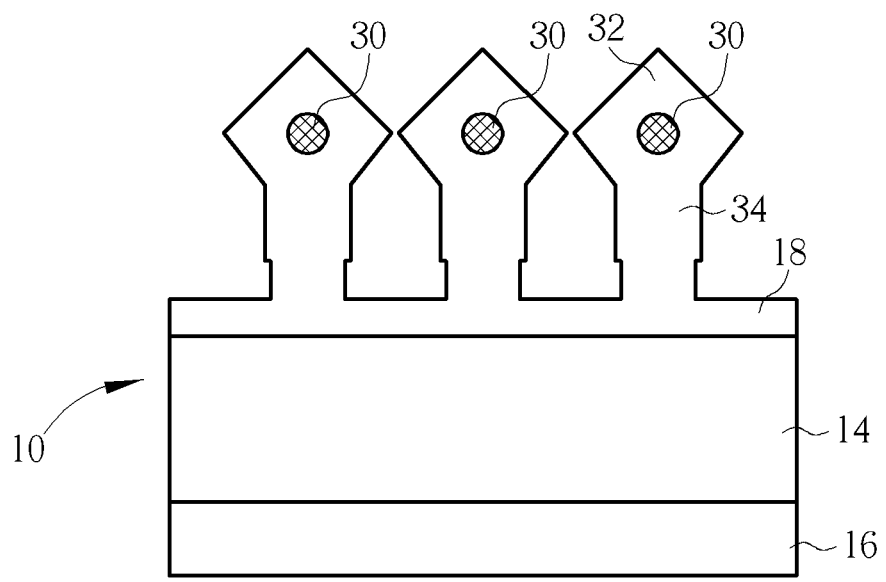

Referring to FIG. 6, an oxidation process is performed. The single crystal silicon layer 12, each fin 20, the first epitaxial layer 24 and the second epitaxial layer 28 are oxidized in the oxidation process to condense the first epitaxial layer 24 and the second epitaxial layer 28 into a germanium-containing nanowire 30, which may be a silicon germanium nanowire. The germanium-containing nanowire 30 has a chemical formula of $Si_{1-z}Ge_z$, where $0.3 \leq Z \leq 0.8$. The oxidation process is advantageously performed at 700 to 900 degrees centigrade for 30 minutes to one hour.

Oxidizing each fin 20, the first epitaxial layer 24 and the second epitaxial layer 28 results in diffusion of silicon outwards and piling up of silicon germanium inwards. The silicon diffuses outwards and is incorporated into oxide to become a silicon oxide shell 32. The silicon germanium piling up inwards becomes a germanium-containing nanowire 30. Each fin 20 is oxidized to become a silicon oxide pillar 34. The silicon oxide shell 32 surrounds the germanium-containing nanowire 30. It is noteworthy that two epitaxial processes are performed to form the first and the second epitaxial layers 24/28 respectively on the upper portion U and the middle portion M of each fin 20. The second epitaxial layer 28 fills up the undercut 26. Therefore, besides the first epitaxial layer 24, the second epitaxial layer 28 can also provide silicon germanium during the oxidization. Consequently, the silicon germanium enters from the upper portion U and the middle portion M of each fin 20 during the oxidization; sufficient silicon germanium can make the silicon germanium condense uniformly. As a result, silicon germanium can be distributed uniformly in the germanium-containing nanowire 30.

According to another preferred embodiment of the present invention, if the operating time for the oxidation process is extended, germanium will pile up and the germanium-containing nanowire becomes a pure germanium nanowire.

Figure 7:
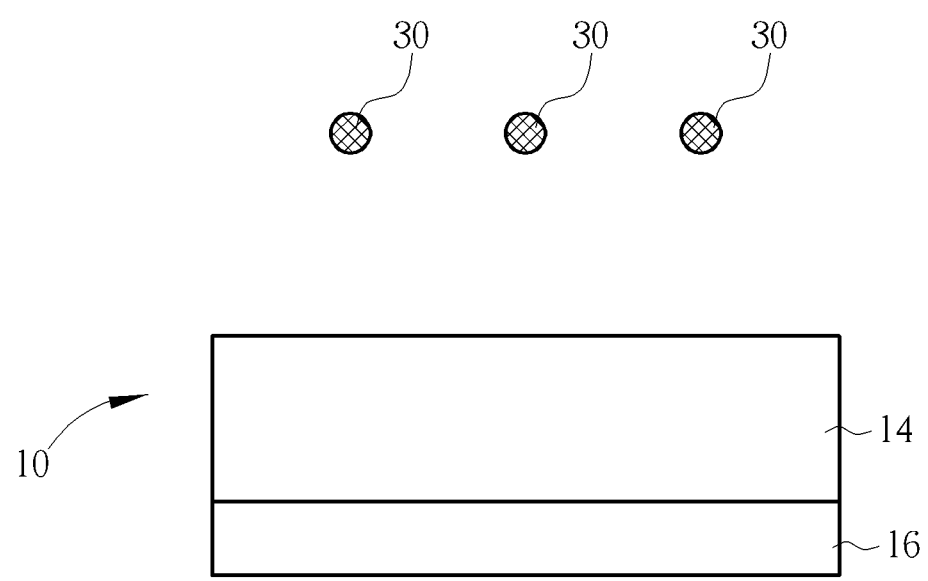

Referring to FIG. 7, the silicon oxide shell 32, the silicon oxide pillar 34 and the silicon oxide layer 18 are removed, and the germanium-containing nanowire 30 is exposed. At this point, the germanium-containing nanowire 30 of the present invention is completed.

The fabricating process of the germanium-containing nanowire can be applied to P-type transistors or N-type transistors. According to a preferred embodiment and based on different requirements, a silicon carbon nanowire can also be applied to suitable transistors. The silicon carbon nanowire can be formed by a similar concept as the germanium-containing nanowire. For example, the silicon carbon nanowire can be formed by forming silicon carbon cladding the upper portion of the fin and then filling the undercuts by silicon carbon at the middle portion of the fin. Subsequently, the silicon carbon is condensed to a silicon carbon nanowire by a suitable process.

Figure 8:
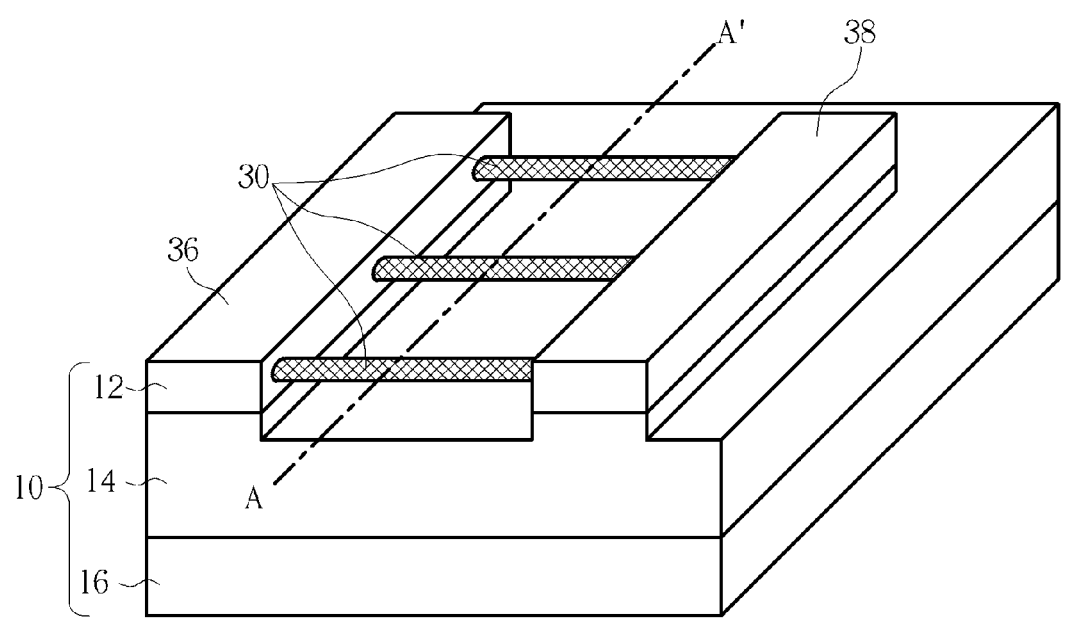
FIG. 8 shows a three dimensional diagram of the germanium-containing nanowires in FIG. 7.

FIG. 8 shows a three dimensional diagram of the germanium-containing nanowires in FIG. 7. FIG. 7 is the sectional view taken along line AA' in FIG. 8. source/drain pad 36 and a source/drain pad 38 are defined on the buried oxide layer 14. The germanium-containing nanowires 30 are suspended between and by the source/drain pad 36 and the source/drain pad 38. The germanium-containing nanowires 30 overhang the buried oxide layer 14 and are electrically connected to the source/drain pad 36 and the source/drain pad 38.

Figure 9:
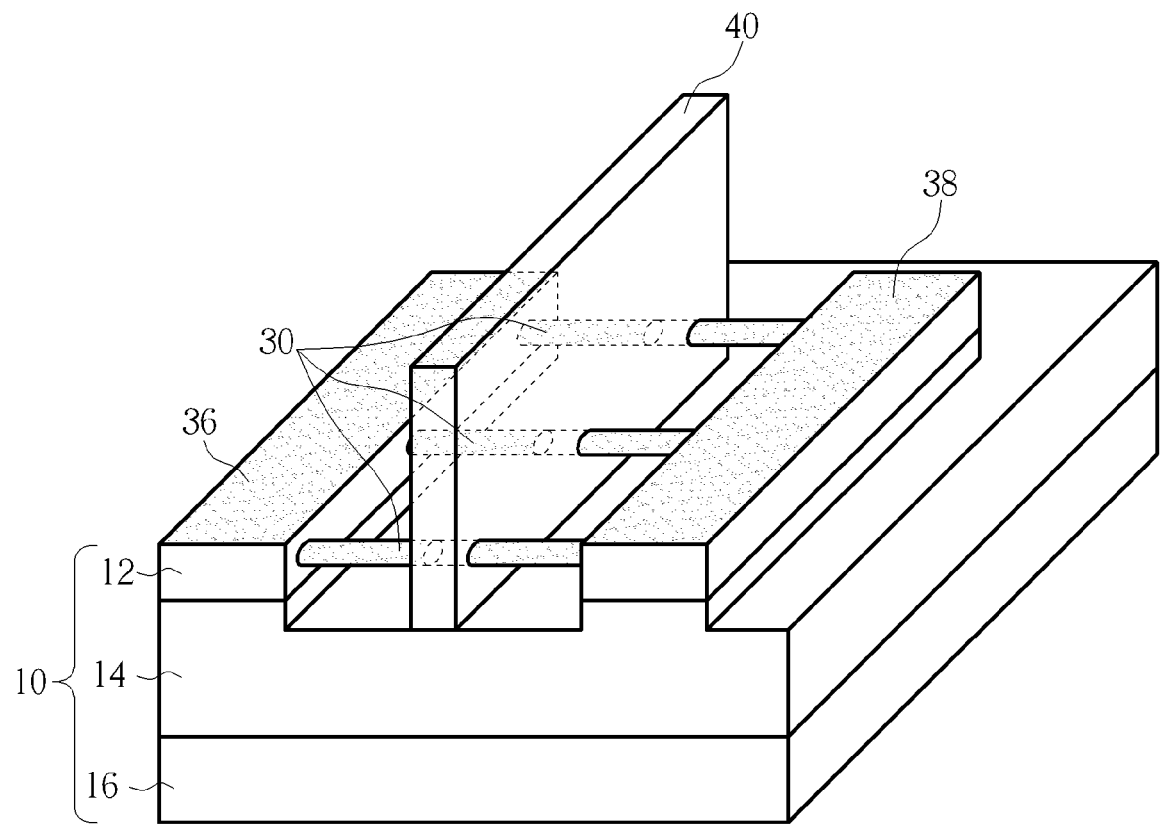
FIG. 9 shows a three dimensional diagram of a transistor comprising germanium-containing nanowires in FIG. 7.

FIG. 9 shows a three dimensional diagram of a transistor comprising germanium-containing nanowires in FIG. 7. As shown in FIG. 9, a gate dielectric layer (not shown) is formed around the germanium-containing nanowires 30 followed by forming a gate electrode 40 intersecting the germanium-containing nanowires 30. Then, a doping region (shown by dots) may be formed in the source/drain pads 36/38 and part of the germanium-containing nanowires 30 to define source and drain regions. After that, a silicide layer (not shown) may be formed on the source/drain pads 36/38.

Figure 10:
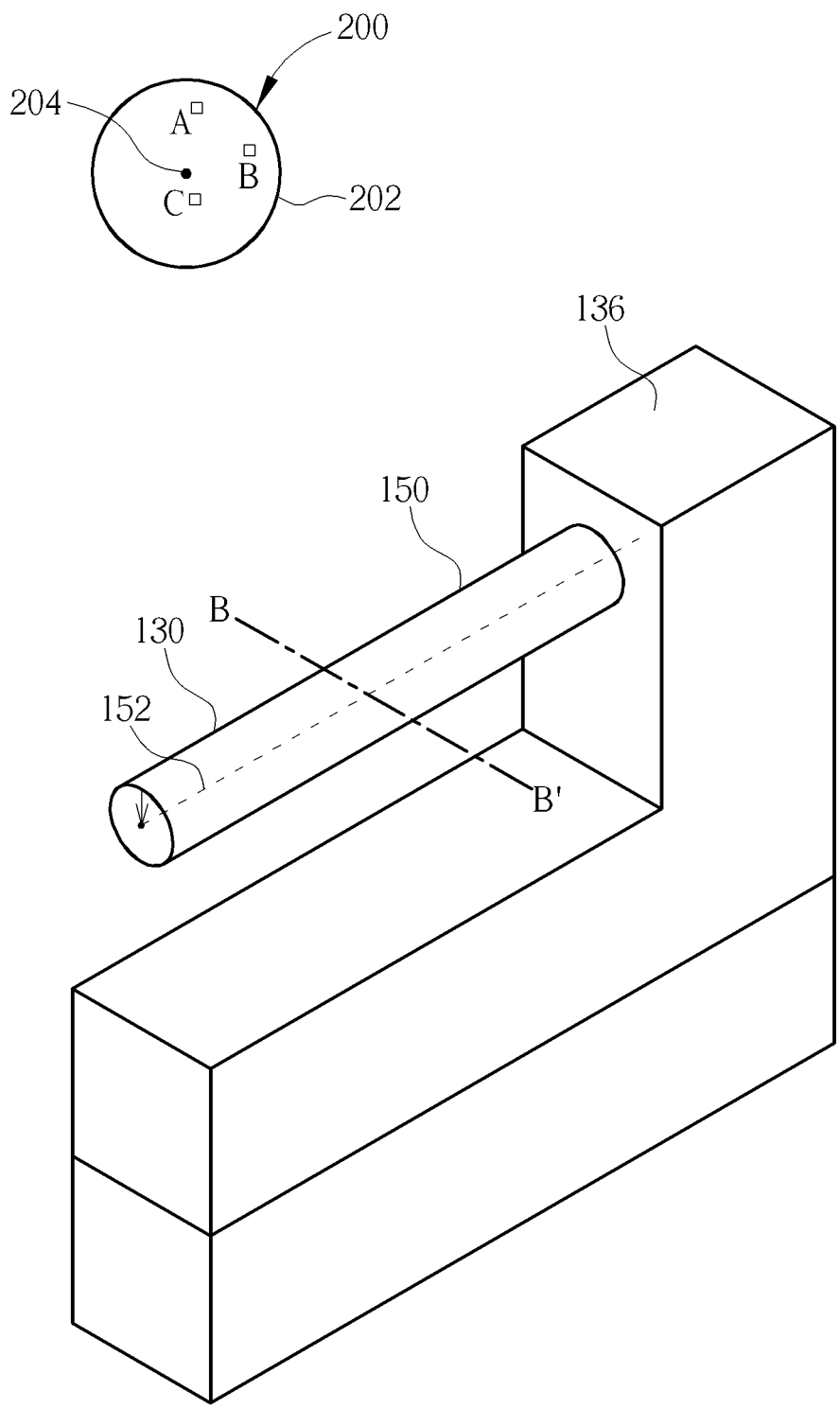
FIG. 10 shows a nanowire schematically according to a preferred embodiment of the present invention.

According to another preferred embodiment, if the substrate 10 is a bulk silicon substrate, another doping region (not shown) having a different conductive type from the source and drain regions may be formed underneath the source and drain regions within the source/drain pads 36/38. The doping region is used as an isolation region to isolate the source and drain regions from the bulk silicon substrate (which does not serve as the source and drain regions). FIG. 10 shows a nanowire schematically according to a preferred embodiment of the present invention. The nanowire 130 is suspended by a pad 136, wherein the nanowire 130 is connected to the pad 136. The nanowire 130 has an outer surface 150 and an axis 152. Furthermore, the nanowire 130 consists of a first type atom and a second type atom. The first type atom is the same type atom as that comprising the pad 136. The second type atom is different from the first type atom. Preferably, the first type atom may be silicon or germanium. The second type atom may be germanium or tin. The nanowire 130 preferably includes silicon germanium, germanium, germanium tin (GeSn), or silicon-germanium-tin (SiGeSn). For example, if the pad 136 consists of silicon and the first type atom is also silicon, the second type atom is germanium. Therefore, nanowire 130 consists of silicon germanium. According to a preferred embodiment of the present invention, the nanowire 130 may have a chemical formula of $Si_{1-z}Ge_z$, where $0.3 \leq Z \leq 0.8$. It is noteworthy that a concentration of the second type atom decreases in a direction (shown by an arrow) from the outer surface 150 to the axis 152. In this embodiment, therefore, the concentration of germanium decreases in the direction from the outer surface 150 to the axis 152.

Continuing to refer to FIG. 10, a cross-section 200 is a sectional view of the nanowire 130 along line BB'. The cross-section 200 may include a circle, a rectangle, a polygon or other shapes. In this embodiment, the cross-section 200 is a circle 202. The circle 202 has a center 204. Regions on the circle 202 which are at a same distance from the center 204 will have a same concentration of the second type atom. For example, if the second type atom is germanium, and the nanowire 200 is silicon germanium nanowire, and a region A and a region B are both disposed at the same distance to the center 204, the region A and the region B have the same concentration of germanium. Furthermore, the regions closer to the center 204 have lower concentration of the second type atom. For example, if the second type atom is germanium, region C has a lower concentration of germanium than region A because region C is nearer to the center 204 than region A.

Because an extra second epitaxial layer fills up the undercuts at the middle portion, during the oxidation process, silicon germanium enters from the middle portion as well as the upper portion. Furthermore, the extra second epitaxial layer can increase the quantity of silicon germanium that can be condensed. Multidirectional entrance of the silicon germanium and large amounts of silicon germanium can make the silicon germanium have uniform electrical characteristics.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A nanowire, suspended by a pad consisting of a first type atom, the nanowire comprising:
   an outer surface;
   an axis;
   the first type atom; and
   a second type atom different from the first type atom, wherein a concentration of the second type atom decreases in a direction from the outer surface to the axis, and the second type atom comprises germanium or tin.

2. The nanowire of claim 1, further comprising a cross section comprising a circle, wherein the circle has a center, and regions on the circle which are at a same distance from the center have a same concentration of the second type atom.

3. The nanowire of claim 1, wherein the nanowire has a chemical formula of $Si_{1-z}Ge_z$, where $0.3 \leq Z \leq 0.8$.

4. The nanowire of claim 1, wherein the first type atom comprises silicon or germanium.

* * * * *